United States Patent Office 3,471,341
Patented Oct. 7, 1969

3,471,341
METHOD OF PREPARING SEMICONDUCTOR WAFERS FOR DIFFUSION

Thomas J. Roach, Palos Verdes Estates, Calif., assignor to International Rectifier Corporation, El Segundo, Calif., a corporation of California No Drawing. Filed Mar. 20, 1967, Ser. No. 624,212
Int. Cl. H01l 7/44; C23g 1/00
U.S. Cl. 148—186 4 Claims

ABSTRACT OF THE DISCLOSURE

A slice or wafer is cut from a silicon ingot and the surfaces of the wafer are lapped until the wafer is brought to the desired thickness. The wafer is thereafter cleaned in a soapy water and is thereafter rinsed from six to ten times with deionized water. The wafer is then placed in a diffusion furnace in the usual manner in order to have selected types of impurity characters diffused therein.

This invention relates to a novel process for the preparation of semiconductor wafers prior to a diffusion cycle and, more particularly, relates to a novel process for cleaning wafers after they are lapped by cleaning with a soapy water and rinsing with deionized water.

It has been found that when the acid etch is replaced by washing in soapy water followed by deionized water rinsing that effective diffusion can be subsequently carried out using a normal diffusion process that would have been used after an acid etch without, however, unknowingly changing the resistivity of the wafer and without affecting the carrier lifetime. This has permitted the formation of junctions having reverse voltage capabilities extremely close to their theoretically calculated value as contrasted to presently available diffused junctions wherein the reverse voltage capabilities are substantially degraded from their theoretically calculated value.

Accordingly, a primary object of this invention is to provide a novel treatment for semiconductor wafers which are to be exposed to a diffusion cycle which does not affect the wafer resistivity.

Yet another object of this invention is to provide a novel treatment for wafers prior to a diffusion cycle which permits the formation of extremely high reverse voltage junctions.

A still further object of this invention is to provide a novel treatment and diffusion process for silicon wafers which have been sliced from an ingot and lapped on their both surfaces which permits the formation of junctions within the wafer which behave in a manner close to that which would be theoretically calculated.

These and other objects will become apparent from the following more detailed description of the invention.

In the past, silicon wafers which are to have one or more junctions formed therein by diffusion techniques have been prepared by suitably forming an ingot of material and then slicing the ingot into a plurality of wafers. The wafer surfaces are then lapped in any suitable lapping device with the wafer thickness being brought to some predetermined value.

The initial ingot would have impurity carriers therein of the N or P type to any desired concentration which is determined by the wafer resistivity. Wafers of this type are either produced in the manufacturer's facilities or purchased from suppliers and are ordered to have a particular resistivity and a particular dopant concentration depending upon the design characteristics of the device which is to be formed. It is universally accepted that lapped wafers which are supplied in this manner and which are to have junctions formed therein by a diffusion process must be cleaned with an acid etch as by dipping in hydrofluoric acid in order to completely clean the wafer and to remove any oxide coatings thereon.

In acordance with the invention, the cleansing after lapping with soapy water followed by deionized water rinsing replaces the formerly universally used hydrofluoric acid etch which was thought essential to remove any oxide coating from the wafer along with other contaminates and disturbed surface portions of the wafer caused by the lapping operation. The acid etch has been found, for reasons not fully understood, to leave impurities on the silicon no matter how thoroughly the wafer is cleaned after the acid etch where these impurities tend to act as an uncontrolled dopant during a subsequent diffusion cycle. This reduces the lifetime of the carriers in the silicon after the diffusion is completed and changes the resistivity of the silicon to some value other than that which was desired in the wafer.

This process of cleaning the wafer prior to diffusion would not be expected to eliminate the adverse effect which would be normally expected due to surface disturbance and oxide layers on the surface of the wafer. The prior art acid etch is always used prior to diffusion to overcome these characteristics. Unexpectedly, however, after diffusion into wafers which are cleaned only with a non-reactive washing, extremely high quality junctions are formed with the resistivity of the silicon being unchanged. In particular, the junctions formed by the diffusion process, where the lapped wafer was simply washed with soapy water and rinsed with deionized water, came extremely close to their theoretically calculated values with relatively high yields.

For example, rectifier devices were formed which showed a sharp avalanche under a reverse voltage of from 2300 to 2500 volts and running in a range of from 2000 volts to about 2900 volts. These devices were formed with a standard diffusion process using a gallium dopant in a manner identical to that commonly used on wafers having the acid etch. Similar wafers which had the prior acid etch after lapping were given the same diffusion treatment but seldom attained avalanche voltages above about 1800 volts.

Although there has been described a preferred embodiment of this novel invention, may variations and modifications will now be apparent to those skilled in the art. Therefore, this invention is to be limited not by the specific disclosure herein, but only by the appending claims.

The embodiments of the invention in which an exclusive privilege or property is claimed are defined as follows:

1. The process of forming a diffused junction wafer comprising the steps of lapping the upper and lower surfaces of a silicon wafer of uniform conductivity type and uniform resistivity; washing said wafer with a non-reactive cleansing solution; rinsing said wafer with water free of impurities and thereafter diffusing a controlled impurity into at least one surface of said wafer to form a junction in said wafer.

2. The process of claim 1 wherein said non-reactive cleansing solution is soapy water.

3. The process of claim 1 wherein said water is deionized water.

4. The process of claim 2 wherein said water is deionized water.

References Cited

UNITED STATES PATENTS 2,947,924 8/1960 Pardue -------------- 148—186

L. DEWAYNE RUTLEDGE, Primary Examiner

R. A. LESTER, Assistant Examiner

U.S. Cl. X.R.

134—2; 148—1.5, 187, 188, 189; 156—17